United States Patent
Taguchi et al.

(10) Patent No.: US 8,013,057 B2
(45) Date of Patent: Sep. 6, 2011

(54) WHITE THERMOSETTING SILICONE RESIN COMPOSITION FOR MOLDING AN OPTICAL SEMICONDUCTOR CASE AND OPTICAL SEMICONDUCTOR CASE

(75) Inventors: Yusuke Taguchi, Annaka (JP); Kazutoshi Tomiyoshi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 171 days.

(21) Appl. No.: 12/405,589

(22) Filed: Mar. 17, 2009

(65) Prior Publication Data
US 2009/0239997 A1  Sep. 24, 2009

(30) Foreign Application Priority Data
Mar. 18, 2008  (JP) .................. 2008-068978

(51) Int. Cl.
  *C08L 83/04* (2006.01)
  *B29D 11/00* (2006.01)
(52) U.S. Cl. .................. 524/588; 264/1.1
(58) Field of Classification Search .......... 264/1.1; 524/588
  See application file for complete search history.

(56) References Cited

U.S. PATENT DOCUMENTS

| | | | | |
|---|---|---|---|---|
| 3,792,012 A | * | 2/1974 | Zdaniewski | 523/213 |
| 4,000,108 A | * | 12/1976 | Yokokawa et al. | 523/219 |
| 4,102,970 A | * | 7/1978 | Deubzer et al. | 264/176.1 |
| 4,376,174 A | * | 3/1983 | Itoh et al. | 523/456 |
| 5,091,460 A | * | 2/1992 | Seto et al. | 524/492 |
| 5,096,990 A | * | 3/1992 | Takayanagi et al. | 528/15 |
| 6,274,890 B1 | * | 8/2001 | Oshio et al. | 257/98 |
| 6,750,273 B2 | * | 6/2004 | Chao | 523/212 |
| 6,756,124 B2 | * | 6/2004 | Kanamori et al. | 428/447 |
| 6,806,509 B2 | * | 10/2004 | Yoshino et al. | 257/103 |
| 2002/0051889 A1 | * | 5/2002 | Kanamori et al. | 428/447 |
| 2003/0071366 A1 | * | 4/2003 | Rubinsztajn et al. | 257/791 |
| 2005/0227393 A1 | | 10/2005 | Sato et al. | |
| 2005/0244649 A1 | * | 11/2005 | Kashiwagi et al. | 428/413 |
| 2006/0035092 A1 | | 2/2006 | Shimizu et al. | |
| 2006/0180925 A1 | * | 8/2006 | Lee et al. | 257/717 |
| 2006/0226774 A1 | * | 10/2006 | Sofue et al. | 313/512 |
| 2007/0007558 A1 | * | 1/2007 | Mazzochette | 257/239 |
| 2007/0284589 A1 | * | 12/2007 | Ng et al. | 257/79 |
| 2008/0057325 A1 | * | 3/2008 | Sakurai et al. | 428/447 |
| 2008/0117619 A1 | * | 5/2008 | Pang et al. | 362/84 |

FOREIGN PATENT DOCUMENTS

JP  2656336 B2  9/1997

(Continued)

*Primary Examiner* — Robert Loewe
(74) *Attorney, Agent, or Firm* — Birch, Stewart, Kolasch & Birch, LLP

(57) ABSTRACT

A white thermosetting silicone resin composition for molding an optical semiconductor case and a case for an optical semiconductor such as LED are provided. The composition comprises (A) a thermosetting organopolysiloxane, (B) a white pigment, (C) an inorganic filler (excluding the white pigment), (D) a condensation catalyst, and (E) a coupling agent represented by the following formula: $R^3_d Si(OR^2)_e$ wherein $R^3$ represents an organic group containing a mercapto group, a glycidyl group, or an amino group, $R^2$ represents a $C_{1-4}$ organic group, d represents 1 or 2, and e represents 2 or 3; wherein content of the white pigment (B) is 1 to 50% by weight in the entire composition, and total content of the white pigment (B) and the inorganic filler (C) is 70 to 93% by weight in the entire composition. When cured, it has excellent whiteness, consistency, and resistance to heat, light, yellowing, and warping.

4 Claims, 1 Drawing Sheet

FOREIGN PATENT DOCUMENTS

| | | |
|---|---|---|
| JP | 9-310007 A | 12/1997 |
| JP | 2000-196151 A | 7/2000 |
| JP | 2001-234032 A | 8/2001 |
| JP | 2001-316591 A | 11/2001 |
| JP | 2002-302533 A | 10/2002 |
| JP | 2003-224305 A | 8/2003 |
| JP | 3512732 B2 | 3/2004 |
| JP | 2005-306952 A | 11/2005 |
| JP | 2006-77234 A | 3/2006 |
| WO | WO 2007099863 A1 * | 9/2007 |

* cited by examiner

WHITE THERMOSETTING SILICONE RESIN COMPOSITION FOR MOLDING AN OPTICAL SEMICONDUCTOR CASE AND OPTICAL SEMICONDUCTOR CASE

CROSS-REFERENCE TO RELATED APPLICATION

This non-provisional application claims priority under 35 U.S.C. §119(a) on Patent Application No. 2008-068978 filed in Japan on Mar. 18, 2008, the entire contents of which are hereby incorporated by reference.

TECHNICAL FIELD

This invention relates to a white thermosetting silicone resin composition for molding an optical semiconductor case which provides a cured article capable of maintaining the excellent whiteness, heat resistance, and light resistance, which has consistent quality with reduced yellowing, and which experiences remarkably reduced warpage after its curing. This invention also relates to a case for an optical semiconductor such as LED comprising the cured product of such composition.

BACKGROUND OF THE INVENTION

Optical semiconductor devices such as LED (Light Emitting Diode) have merits such as reduced size, high efficiency, bright color, long life without burning out, high performance, and resistance to vibration and repeated ON/OFF switching, and therefore, these devices are widely used as various indicators and light sources. The material which has been widely used for producing the case of the optical semiconductor apparatus using such optical semiconductor device is polyphthalamide resin (PPA).

However, with the dramatic advance in the optical semiconductor technology, optical semiconductor apparatus has experienced rapid increase in the power and use of shorter wavelength. Encapsulation of the optical semiconductor device and the case produced by using the conventional PPA resin experiences severe deterioration in the prolonged use as well as color inconsistency, peeling, and loss of mechanical strength. There is a request for solving such problems in an efficient manner.

More specifically, Japanese Patent No. 2656336 discloses an optical semiconductor apparatus in which the resin used for the encapsulation is a B-stage epoxy resin for encapsulating an optical semiconductor comprising an epoxy resin, a curing agent, and a curing aid, and such components are homogeneously mixed at the molecular level. The epoxy resin used is mainly bisphenol A epoxy resin or bisphenol F epoxy resin, and use of triglycidllyl isocyanate and the like is also indicated. However, in the Examples, a small amount of triglycidyl isocyanate is used by adding to the bisphenol A or the bisphenol F epoxy resin. In the investigation by the inventors of the present invention, this B stage epoxy resin composition for encapsulating an optical semiconductor has been found to experience yellowing when left at high temperature for a long time.

Japanese Patent Application Laid-Open Nos. 2000-196151, 2003-224305, and 2005-306952 discloses use of a triazine derivative epoxy resin in an epoxy resin composition for encapsulating LED light-emitting device. However, the problem of yellowing after leaving at an elevated temperature or after using a prolonged period was not fully obviated by these resin compositions.

Japanese Patent Application Laid-Open No. 2006-77234 discloses a resin composition for encapsulating an LED device containing an organopolysiloxane having a weight average molecular weight of at least $5\times10^3$ and a condensation catalyst. However, this organopolysiloxane needs to be a transparent organopolysiloxane which is liquid at room temperature, and such organopolysiloxane is inadequate for use in transfer molding or compression molding.

In addition to the publications as mentioned above, the prior art publications which may be relevant with the present invention include the following documents:
Japanese Patent No. 3512732,
Japanese Patent Application Laid-Open No. 2001-234032,
Japanese Patent Application Laid-Open No. 2002-302533,
Japanese Patent Application Laid-Open No. 9-310007, and
Japanese Patent Application Laid-Open No. 2001-316591.

In addition, size of the molded package has recently become increasingly large as in the case of MAP (matrix array package), and this has resulted in the severer warpage after curing and invited various troubles in the course of package transportation and cutting into individual units.

SUMMARY OF THE INVENTION

The present invention has been completed in view of such situation, and an object of the present invention is to provide a white thermosetting silicone resin composition for molding an optical semiconductor case which provides a cured article capable of maintaining the excellent whiteness, heat resistance, and light resistance, which has consistent quality with reduced yellowing, and which experiences reduced warpage after the curing. Another object of the present invention is to provide an optical semiconductor case comprising the cured product of such composition.

The inventors of the present invention made an intensive study and found that a white thermosetting silicone resin composition for molding an optical semiconductor case, comprising
(A) 100 parts by weight of a thermosetting organopolysiloxane,
(B) 3 to 200 parts by weight of a white pigment,
(C) 400 to 1,000 parts by weight of an inorganic filler (excluding the white pigment),
(D) 0.01 to 10 parts by weight of a condensation catalyst, and
(E) 0.1 to 8 parts by weight of a coupling agent represented by the following structural formula (2):

$$R^3{}_d Si(OR^2)_e \qquad (2)$$

wherein $R^3$ represents an organic group of 1 to 10 carbon atoms containing a mercapto group, a glycidyl group, or an amino group, $R^2$ independently represents an organic group of 1 to 4 carbon atoms, d represents 1 or 2, and e represents 2 or 3; wherein
content of the white pigment (B) is 1 to 50% by weight in relation to the entire white thermosetting silicone resin composition, and total content of the white pigment (B) and the inorganic filler (C) is 70 to 93% by weight in the entire white thermosetting silicone resin composition provides a cured article capable of maintaining the excellent whiteness, heat resistance, and light resistance, which has consistent quality with reduced yellowing, and which experiences remarkably reduced warpage after the curing, and an optical semiconductor system having an optical semiconductor case for LED or the like that has been produce by using such composition is useful. The present invention has been completed on the bases of such finding.

Accordingly, the present invention provides the white thermosetting silicone resin composition for molding an optical semiconductor case and the optical semiconductor case as described below.

[1] A white thermosetting silicone resin composition for molding an optical semiconductor case, comprising
(A) 100 parts by weight of a thermosetting organopolysiloxane,
(B) 3 to 200 parts by weight of a white pigment,
(C) 400 to 1,000 parts by weight of an inorganic filler (excluding the white pigment),
(D) 0.01 to 10 parts by weight of a condensation catalyst, and
(E) 0.1 to 8 parts by weight of a coupling agent represented by the following structural formula (2):

$$R^3{}_d Si(OR^2)_e \quad (2)$$

wherein $R^3$ represents an organic group of 1 to 10 carbon atoms containing a mercapto group, a glycidyl group, or an amino group, $R^2$ independently represents an organic group of 1 to 4 carbon atoms, d represents 1 or 2, and e represents 2 or 3; wherein
content of the white pigment (B) is 1 to 50% by weight in relation to the entire white thermosetting silicone resin composition, and total content of the white pigment (B) and the inorganic filler (C) is 70 to 93% by weight in the entire white thermosetting silicone resin composition.

[2] The white thermosetting silicone resin composition for molding an optical semiconductor case according to the above [1], wherein the thermosetting organopolysiloxane (A) is the one represented by the following average compositional formula (1):

$$(CH_3)_a Si(OR^1)_b (OH)_c O_{(4-a-b-c)/2} \quad (1)$$

wherein $R^1$ independently represents an organic group of 1 to 4 carbon atoms, and a, b, and c are numbers satisfying the relations: $0.1 \leq a \leq 1.1$, $0 \leq b \leq 0.3$, $0.001 \leq c \leq 0.5$, and $0.801 \leq a+b+c < 2$.

[3] The white thermosetting silicone resin composition for molding an optical semiconductor case according to the above [1] or [2], wherein the white pigment (B) is titanium oxide.

[4] The white thermosetting silicone resin composition for molding an optical semiconductor case according to any one of the above [1] to [3], which provides a cured product having a coefficient of linear expansion at a temperature not lower than the glass transition temperature of 10 to 40 ppm.

[5] An optical semiconductor case comprising the cured article of the white thermosetting silicone resin composition for molding an optical semiconductor case of any one of the above [1] to [4], the interior of the case being encapsulated by a transparent resin.

The present invention will provide a white thermosetting silicone resin composition for molding an optical semiconductor case which provides a cured article capable of maintaining the excellent whiteness, heat resistance, and light resistance, which has consistent quality with reduced yellowing, and which experiences reduced warpage after the curing, as well as a case for an optical semiconductor such as LED comprising the cured product of such composition.

DETAILED DESCRIPTION OF THE INVENTION

Figure 1:
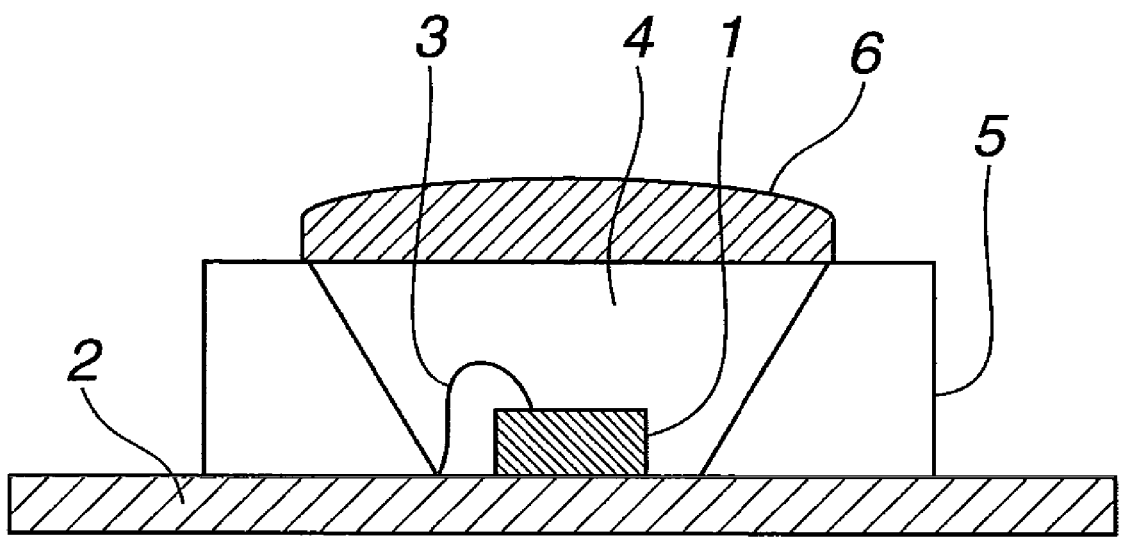
FIG. 1 schematically shows an embodiment of an optical semiconductor case (LED reflector) produced by using the white thermosetting silicone resin composition for molding an optical semiconductor case of the present invention.

Next, the present invention is described in further detail.
(A) Thermosetting Organopolysiloxane
The thermosetting organopolysiloxane (A) of the present invention is a silanol group-containing organopolysiloxane which is a silicone polymer represented by the compositional formula (1):

$$(CH_3)_a Si(OR^1)_b (OH)_c O_{(4-a-b-c)/2} \quad (1)$$

wherein $R^1$ independently represents an organic group having 1 to 4 carbon atoms, and a, b, and c are numbers satisfying: $0.1 \leq a \leq 1.1$, $0 \leq b \leq 0.3$, $0.001 \leq c \leq 0.5$, and $0.801 \leq a+b+c < 2$.

Examples of the organic group $R^1$ having 1 to 4 carbon atoms in the average compositional formula (1) include an alkyl group and an alkenyl group. Accordingly, examples of the $OR^1$ include methoxy group, ethoxy group, propoxy group, isopropoxy group, and butoxy group, and use of methoxy group or isopropoxy group is preferable since they are readily available.

In the average compositional formula (1), a, b, and c are respectively a number satisfying $0.1 \leq a \leq 1.1$, $0 \leq b \leq 0.3$, $0.001 \leq c \leq 0.5$, and $0.801 \leq a+b+c < 2$, and more preferably, $0.5 \leq a \leq 1.0$, $0.001 \leq b \leq 0.3$ (in particular, $0.001 \leq b \leq 0.2$), $0.01 \leq c \leq 0.5$ (in particular, $0.01 \leq c \leq 0.3$), and $0.911 \leq a+b+c \leq 1.8$.

When the content "a" of the $CH_3$ group bonded to the Si atom is less than 0.1, the resulting composition will be hard and the composition will have reduced crack resisting properties while the content of "c" in excess of 1.1 means the increased $CH_3$ group and the resulting composition will exhibit excessive hydrophobicity and softness, resulting in the loss of the crack resisting properties and inferior outer appearance such as cissing. Content "b" of the $OR^1$ bonded to the Si atom in excess of 0.3 will result in the increased amount of the terminal group and reduced molecular weight, and the resulting composition will fail to exhibit the crack preventive properties. When the content "c" of the OH group bonded to the Si atom is in excess of 0.5, the organopolysiloxane will be involved at a higher degree in the condensation reaction in the curing at an elevated temperature, and this will result in the higher hardness and poor crack resistance. On the other hand, content "c" of less than 0.001 is likely to result in the increased melting point, and hence, in the poor workability. For controlling "c", the alkoxy group is preferably condensed at complete condensation degree of 86 to 96%. At less than 86%, the melting point will be unduly low whereas the degree in excess of 96% may result in an excessively high melting point.

The component (A) having the average compositional formula (1) can be generally represented by the combination of Q unit ($SiO_{4/2}$) from a tetrafunctional silane and T unit ($CH_3SiO_{3/2}$) from a trifunctional silane. When the component (A) is represented by this way, the proportion of the T unit represented by $CH_3SiO_{3/2}$ in relation to the total molar amount of the entire siloxane unit is preferably at least 70% by mole, more preferably at least 75% by mole, and most preferably at least 80% by mole. When the content of the T unit is less than 70% by mole, the total balance between the hardness, adhesion, outer appearance, and the like will be unfavorable. In this case, the remainder may comprise the Q unit, and the Q unit is preferably up to less than 30% by mole. With regard to the melting point, increase in the Q unit is likely to result in the higher melting point.

The component (A) can be obtained as a hydrolytic condensate of an organosilane represented by the following average compositional formula (3):

$$(CH_3)_n SiX_{4-n} \quad (3)$$

wherein X is a halogen atom such as chlorine or an alkoxy group, and in particular, an alkoxy group containing 1 to 4 carbon atoms, and n is 1 or 0.

In this case, X is preferably a halogen atom, and in particular, chlorine atom in view of obtaining a solid organopolysiloxane.

Examples of the silane compound represented by the average compositional formula (3) include methyltrichlorosilane, methyltrimethoxysilane, methyltriethoxysilane, tetrachlorosilane, tetramethoxy silane, and tetraethoxysilane.

The hydrolysis and the condensation of the silane compound having the hydrolyzable group may be conducted by the method commonly used in the art, for example, in the presence of an acid catalyst such as acetic acid, hydrochloric acid, or sulfuric acid or an alkaline catalyst such as sodium hydroxide, potassium hydroxide, or tetramethylammonium hydroxide. For example, when a silane having chloro group as its hydrolyzable group is used, the desired hydrolytic condensation product having the desired molecular weight can be produced by using the hydrochloric acid generated by water addition for the catalyst.

Amount of water added in the hydrolysis and concentration is typically 0.9 to 1.6 mole, and preferably 1.0 to 1.3 mole per 1 mole of the total amount of the hydrolyzable group in the silane compound having a hydrolyzable group when the hydrolyzable group in the silane compound is chloro group. When the water is added in such range of 0.9 to 1.6 mole, the composition will have excellent workability, and the resulting cured product will enjoy improved toughness.

The silane compound having a hydrolyzable group is preferably used by hydrolyzing in an organic solvent such as an alcohol, a ketone, an ester, a cellosolve, or an aromatic compound. Exemplary preferable such organic solvents include an alcohol such as methanol, ethanol, isopropyl alcohol, isobutyl alcohol, n-butanol, and 2-butanol, and an aromatic compound such as toluene and xylene, and the more preferred is the combined use of isopropyl alcohol and toluene in view of improving the curability of the composition and the toughness of the cured product.

The hydrolysis and the condensation are preferably conducted at a reaction temperature of 10 to 120° C., and more preferably 20 to 100° C. When the reaction temperature is within such range, the resulting hydrolytic condensate will solid with no occurrence of gelation. Such solid hydrolytic condensate can be readily used in the subsequent step.

For example, in the embodiment using methyltrichlorosilane, water and isopropyl alcohol are added to the methyltrichlorosilane which had been dissolved in toluene for partial hydrolysis (reaction temperature, −5 to 100° C.), and subsequently water of the amount capable of hydrolyzing all of the remaining chloro group is added to promote the reaction and thereby obtain a solid silicone polymer having a melting point of 76° C.

Examples of the organopolysiloxane represented by the average compositional formula (1) include those represented by the following formulae (4) and (5):

$$(CH_3)_{0.5}Si(OC_3H_7)_{0.06}(OH)_{0.11}O_{1.7} \quad (4), and$$

$$(CH_3)_{1.0}Si(OC_3H_7)_{0.07}(OH)_{0.13}O_{1.4} \quad (5)$$

which are obtained when methyltrichlorosilane is used for the starting material.

(B) White Pigment

The white pigment (B) of the present invention is incorporated as a white colorant for increasing the whiteness. The white pigment used is preferably titanium dioxide, and the unit cell of the titanium dioxide may have any one of rutile, anatase, and Brookite structures, the rutile structure being the preferred. The white pigment is not limited for its average particle size and the shape, and the average particle size is typically 0.05 to 5.0 μm. The titanium dioxide may be preliminarily surface treated by a hydrous oxide of Al or Si to improve compatibility with and dispersibility in the resin or the inorganic filler.

The average particle size is measured by determining weight average $D_{50}$ (or median diameter) in the particle size distribution measurement by laser optical diffractometry.

In addition to the titanium dioxide, the white pigment (white colorant) may also comprise potassium titanate, zirconium oxide, zinc sulfide, zinc oxide, or magnesium oxide which may be used alone or in combination with the titanium dioxide.

The white pigment is preferably incorporated at an amount of 3 to 200 parts by weight, more preferably 5 to 150 parts by weight, and most preferably 10 to 120 parts by weight in relation to 100 parts by weight of the component (A). When incorporated at an amount of less than 3 parts by weight, sufficient whiteness may not be realized, and the article produced by curing the white thermosetting silicone resin composition may fail to exhibit the initial reflectivity of at least 70% and the reflectivity after the deterioration test at 180° C. for 24 hours of at least 70%. When incorporated at an amount in excess of 200 parts by weight, content of other components incorporated for improving the mechanical strength will be unduly low. It is to be noted that the white pigment is preferably incorporated at an amount of 1 to 50% by weight, more preferably at 5 to 30% by weight, and most preferably at 10 to 30% by weight in relation to the entire white thermosetting silicone resin composition.

(C) Inorganic Filler

The inorganic filler (c) of the present invention may be the one commonly incorporated in an epoxy resin composition. Exemplary such inorganic fillers include silicas such as fused silica, fused spherical silica, and crystalline silica, alumina, silicon nitride, aluminum nitride, boron nitride, and antimony trioxide, while the white pigments (white colorants) as described above are not included in the inorganic filler (c). The inorganic filler is not particularly limited for its average particle size or shape. The average particle size, however, is typically in the range of 5 to 40 μm. The average particle size is measured by weight average $D_{50}$ (or median diameter) in the particle size distribution measurement by determining laser optical diffractometry.

The most preferred are fused silica and fused spherical silica, and the average particle size is preferably 4 to 40 μm, and more preferably 7 to 35 μm in view of the moldability and flowability although the particle size is not particularly limited. For the purpose of improving the flowability, use of the silica having a fine particle size such as up to 3 μm and in combination with the silica having intermediate particle size of 4 to 8 μm, and coarse particle size of 10 to 40 μm is desirable.

The inorganic filler may also contain the one preliminarily subjected to a surface treatment with a coupling agent such as a silane coupling agent or a titanate coupling agent in order to improve bonding strength between the resin and the inorganic filler.

Exemplary preferable coupling agents include epoxy functional alkoxysilanes such as γ-lycidoxypropyltrimethoxysilane, γ-glycidoxypropylmethyldiethoxysilane, and β-(3,4-epoxycyclohexyl)ethyltrimethoxysilane; amino functional alkoxysilanes such as N-β-(aminoethyl)-γ-aminopropyltrimethoxysilane, γ-aminopropyltriethoxysilane, and N-phenyl-γ-aminopropyltrimethoxysilane; and mercapto functional alkoxysilanes such as γ-mercaptopropyltrimethoxysilane. The amount of the coupling agent and the method used for the surface treatment are not particularly limited.

The inorganic filler is preferably incorporated at an amount of 400 to 1,000 parts by weight, and more preferably at 600 to 950 parts by weight in relation to 100 parts by weight of the component (A). When incorporated at an amount less than 400 parts by weight, the desired coefficient of linear expansion may not be realized, while incorporation at an amount in excess of 1,000 parts by weight may result in the filling failure due to the increased viscosity and the loss of softness, which may in turn invite peeling win the device. The inorganic filler is preferably incorporated at an amount such that total content of this inorganic filler and the white pigment is 70 to 93% by weight, and in particular, 75 to 91% by weight in relation to the entire white thermosetting silicone resin composition.

(D) Condensation Catalyst (Curing Catalyst)

The curing catalyst (D) of the present invention is a condensation catalyst which cures the thermosetting organopolysiloxane (A). This condensation catalyst is selected by considering the stability of the component (A), hardness of the film, resistance to yellowing, curability, and the like. For example, basic compounds such as trimethylbenzylammonium hydroxide, tetramethylammonium hydroxide, n-hexylamine, tributylamine, diazabicycloundecene (DBU), and dicyanide diamide; metal containing compounds such as tetraisopropyl titanate, tetrabutyl titanate, titanium acetylacetonate, aluminum triisobutoxide, aluminum triisopropoxide, zirconium tetra(acetylacetonate), zirconium tetrabutylate, cobalt octylate, cobalt acetylacetonate, iron acetylacetonate, tin acetylacetonate, dibutyltin octylate, dibutyltin dilaurate, zinc octylate, zinc benzoate, zinc p-tert-butylbenzoate, zinc laurate, zinc stearate, aluminum phosphate, and aluminum triisopropoxide; aluminum tris-acetylacetonate, and aluminum bisethylacetoacetate-monoacetylacetonate; and organo-titanium chelate compounds such as diisopropoxy bis(ethylacetoacetate)titanium and diisopropoxy bis(ethylacetoacetate)titanium. Among these, the preferred are zinc octylate, zinc benzoate, p-tert-butyl zinc benzoate, zinc laurate, zinc stearate, aluminum phosphate, aluminum triisopropoxide, and organo-titanium chelate compounds, and the particularly preferred are zinc benzoate and organo-titanium chelate compounds.

The condensation catalyst is preferably incorporated at an amount of 0.01 to 10 parts by weight, and more preferably at 0.1 to 6 parts by weight in relation to 100 parts by weight of the component (A). Use of the condensation catalyst at such amount results in the favorable curability and the composition will be stable.

(E) Coupling Agent

The coupling agent (E) of the present invention is represented by the following structural formula (2):

$$R^3{}_d Si(OR^2)_e \quad (2)$$

wherein $R^3$ represents an organic group having 1 to 10 carbon atoms and containing mercapto group, glycidyl group, or amino group, $R^2$ independently represents an organic group having 1 to 4 carbon atoms which is the same as $R^1$ as defined above, d is an integer selected from 1 and 2, and e is an integer selected from 2 and 3.

Exemplary such coupling agents include mercapto functional alkoxysilanes such as γ-mercaptopropyltrimethoxysilane; epoxy functional alkoxysilanes such as γ-glycidoxypropyltrimethoxysilane, γ-glycidoxypropylmethyldiethoxysilane, and β-(3,4-epoxycyclohexyl)ethyl trimethoxysilane; and amino functional alkoxysilanes such as N-β-(aminoethyl)-γ-aminopropyltrimethoxysilane, γ-aminopropyltriethoxysilane, and N-phenyl-γ-aminopropyltrimethoxysilane. In particular, when a silver-plated copper frame, a Au-plated copper frame, or a Ni—Pd—Au-plated copper frame is used for the insert of the optical semiconductor device case, use of a mercapto functional alkoxysilane is preferable. Such coupling agent is preferably used at an amount of 0.1 to 8 parts by weight, and more preferably, at 0.5 to 6 parts by weight in relation to 100 parts by weight of the component (A). When used at less than 0.1 parts by weight, adhesion of the composition to the underlying substrate will be insufficient, and use at an amount in excess of 8 parts by weight results in an extremely reduced viscosity which may invite void formation and flash.

(F) Other Additives

Other adequate additives may also be incorporated in the white thermosetting silicone resin composition for molding an optical semiconductor case of the present invention. Exemplary such additives include a whisker, a silicone powder, a thermoplastic resin, a thermoplastic elastomer, an organic synthetic rubber, an internal mold release agent such as fatty acid ester, glyceric acid ester, zinc stearate, and sodium stearate which are added for the purpose of improving the resin properties, and these may be added at an amount that does not adversely affect the merits of the present invention.

If necessary, the white thermosetting silicone resin composition for molding an optical semiconductor case of the present invention may also contain an antioxidant such as a phenol, phosphor, or sulfur antioxidant incorporated. However, the resin composition of the present invention is associated with reduced discoloration compared to the conventional thermosetting silicone resin compositions even without incorporation of such antioxidants.

The silicone resin composition of the present invention is a thermosetting resin, and cures by heating to, for example, 150 to 185° C. for 30 to 180 seconds. In such case, however, the resin may be further subjected to a post-curing at 150 to 180° C. for 2 to 20 hours.

The cured article produced by molding the composition of the present invention may have a glass transition temperature generally in the range of −20 to 10° C. although the glass transition temperature is determined by the structure of the organopolysiloxane in the composition or amount of the inorganic filler added in the composition. The article produced by curing the composition of the present invention may preferably have a coefficient of linear expansion at a temperature higher than the glass transition temperature of 10 to 40 ppm, and more preferably 10 to 30 ppm. The temperature higher than the glass transition temperature may be in the range of 25 to 175° C., and in particular 60 to 120° C. This temperature, however, is not particularly limited. The range of 10 to 40 ppm of the coefficient of linear expansion is mainly determined by the content of the inorganic filler as described above. Increase in the amount of the inorganic filler is required to reduce the coefficient of linear expansion to less than 10 ppm, and such increase will invite loss of flowability and the molding will be difficult. In the meanwhile, the coefficient of linear expansion in excess of 40 ppm will invite increased warpage after molding the optical semiconductor case, and transportation as well as cutting of the molded article will be difficult.

The article produced by using the white thermosetting silicone resin composition for molding an optical semiconductor case of the present invention comprising the components (A) to (E) may preferably have an initial reflectivity measured at the wavelength of 450 nm of at least 70%, more preferably at least 80%, and most preferably at least 85%, and the reflectivity after the deterioration test at 180° C. for 24 hours of at least 70%, more preferably at least 80%, and most preferably at least 85%. When the reflectivity is less than 70%, the article will suffer from reduced life when used as a semiconductor device case for LED. The article may also have a reflectivity after 24 hour irradiation by using a high pressure mercury lamp having a peak wavelength of 365 nm (60 mW/cm) of at least 70%, more preferably at least 80%, and most preferably at least 85%.

Such reflectivity can be realized by using the silanol group-containing organopolysiloxane represented by the formula (1) for the component (A) simultaneously with the incorporation of the white pigment, and in particular, the titanium oxide at the amount as described above.

The white thermosetting silicone resin composition for molding an optical semiconductor case of the present invention can be used for molding an optical semiconductor case. The optical semiconductor case produced is the one accommodating an optical semiconductor such as LED encapsulated by a transparent resin such as a silicone resin, an epoxy resin, or the like in its interior, and surface at which the optical semiconductor contacts with the transparent resin encapsulating the optical semiconductor becomes the reflecting surface (reflector).

Accordingly, the white thermosetting silicone resin composition for molding an optical semiconductor case of the present invention can be efficiently used for encapsulation of a semiconductor or electronic device, and in particular, for an LED case or an encapsulating resin for a photocoupler.

FIG. 1 shows a cross sectional view of an LED reflector produced by using the white thermosetting silicone resin composition for molding an optical semiconductor case of the present invention. In the LED shown in FIG. 1, a semiconductor device 1 comprising a compound semiconductor is mounted on a lead frame 2 by die bonding, and the semiconductor device 1 is further connected to another lead frame (not shown) by wire bonding by a bonding wire 3. A light receiving semiconductor device (not shown) is also mounted on a lead frame (not shown) by die bonding so that it faces the semiconductor device 1, and this light receiving semiconductor device is further connected to another lead frame (not shown) by wire bonding by a bonding wire (not shown). The space between these semiconductor devices is encapsulated with a transparent encapsulating resin 4. The semiconductor devices encapsulated in the transparent encapsulating resin 4 are supported (by resin encapsulation) by the cured white thermosetting silicone resin composition for molding an optical semiconductor case of the present invention (optical semiconductor case which is a white reflector) 5. 6 is a lens.

The methods most commonly used in such a case for the encapsulation using the white thermosetting silicone resin composition for molding an optical semiconductor case of the present invention are transfer molding and compression molding.

The transfer molding is conducted by using a transfer molding machine. More specifically, the transfer molding is preferably conducted at a molding pressure of 5 to 20 N/mm² and a molding temperature of 120 to 190° C. for 30 to 500 seconds, and more preferably at 150 to 185° C. for 30 to 180 seconds. The compression molding is conducted by using a compression molding machine. More specifically, the compression molding is preferably conducted at a molding temperature of 120 to 190° C. for 30 to 600 seconds, and more preferably at 130 to 160° C. for 120 to 300 seconds. In either method, post curing may be conducted at 150 to 185° C. for 2 to 20 hours.

EXAMPLES

Next, the present invention is described in further detail by referring to the Examples and Comparative Examples, which by no means limit the scope of the present invention.

The materials used in the Examples and Comparative Examples are as described below.

(A) Thermosetting Organopolysiloxane

Synthetic Example 1

100 parts by weight of methyltrichlorosilane and 200 parts by weight of toluene were placed in a 1 L flask, and a mixture of 8 parts by weight of water and 60 parts by weight of isopropyl alcohol was added dropwise in an ice bath and at an interior temperature of −5 to 0° C. for 5 to 20 hours. The mixture was then heated to reflux temperature, and stirring was continued for 20 minutes. The mixture was cooled to room temperature, and 12 parts by weight of water was added dropwise at a temperature of up to 30° C. for 30 minutes. After stirring for 20 minutes, 25 parts by weight of water was added, and stirring was continued at 40 to 45° C. for 60 minutes. 200 parts by weight of water was then added to separate the organic layer. This organic layer was washed until the solution became neutral. The water was azeotropically removed, and the residual solution was filtered and stripped under a reduced pressure to obtain 36.0 parts by weight of a colorless transparent solid represented by the following formula (6) (melting point, 76° C.) (thermosetting organopolysiloxane (A-1)).

$$(CH_3)_{1.0}Si(OC_3H_7)_{0.07}(OH)_{0.10}O_{1.4} \tag{6}$$

Synthetic Example 2

80 parts by weight of methyltrichlorosilane, 20 parts by weight of tetraethoxysilane, and 200 parts by weight of toluene were placed in a 1 L flask, and a mixture of 8 parts by weight of water and 60 parts by weight of isopropyl alcohol was added dropwise in an ice bath and at an interior temperature of −5 to 0° C. for 5 to 20 hours. The mixture was then heated to reflux temperature, and stirring was continued for 20 minutes. The mixture was cooled to room temperature, and 12 parts by weight of water was added dropwise at a temperature of up to 30° C. for 30 minutes. After stirring for 20 minutes, 25 parts by weight of water was added, and stirring was continued at 40 to 45° C. for 60 minutes. 200 parts by weight of water was then added to separate the organic layer. This organic layer was washed until the solution became neutral. The water was azeotropically removed, and the residual solution was filtered and stripped under a reduced pressure to obtain 36.0 parts by weight of a colorless transparent solid represented by the following formula (7) (melting point, 76° C.) (thermosetting organopolysiloxane (A-2)).

$$(CH_3)_{0.5}Si(OC_3H_7)_{0.06}(OH)_{0.15}O_{1.65} \tag{7}$$

Comparative Synthetic Example 1

20 parts by weight of methyltrichlorosilane, 86.2 parts by weight of dimethyldichlorosilane, and 200 parts by weight of toluene were placed in a 1 L flask, and a mixture of 8 parts by weight of water and 60 parts by weight of isopropyl alcohol was added dropwise in an ice bath and at an interior temperature of −5 to 0° C. for 5 to 20 hours. The mixture was then heated to reflux temperature, and stirring was continued for 20 minutes. The mixture was cooled to room temperature, and 12 parts by weight of water was added dropwise at a temperature of up to 30° C. for 30 minutes. After stirring for 20 minutes, 25 parts by weight of water was added, and stirring was continued at 40 to 45° C. for 60 minutes. 200 parts by weight of water was then added to separate the organic layer. This organic layer was washed until the solution became neutral. The water was azeotropically removed, and the residual solution was filtered and stripped under a reduced pressure to obtain 32.0 parts by weight of a colorless transparent viscous solid represented by the following formula (8) (melting point, 76° C.) (thermosetting organopolysiloxane (A-3)).

$(CH_3)_{1.5}Si(OCH_3)_{0.07}(OH)_{0.12}O_{1.20}$ (8)

(B) White Pigment
- B-1: titanium dioxide of rutile structure having an average particle size of 0.28 μm (CR-95: manufactured by Ishihara Sangyo Kaisha, Ltd.)

(C) Inorganic Filler
- C-1: spherical fused silica having an average particle size of 30 μm (FB-570: manufactured by Denki Kagaku Kogyo Kabushiki Kaisha)
- D-1: zinc benzoate (manufactured by Wako Pure Chemical Industries, Ltd.)

(E) Coupling Agent
- E-1: γ-mercaptopropyltrimethoxysilane (KBM803: manufactured by Shin-Etsu Chemical Co., Ltd.)
- E-2: γ-trimethoxysilane (KBM403E: manufactured by Shin-Etsu Chemical Co., Ltd.)
- E-3: N-phenyl-γ-aminopropyltrimethoxysilane (KBM503: manufactured by Shin-Etsu Chemical Co., Ltd.)

Examples 1 to 7 and Comparative Examples 1 to 3

The thermosetting organopolysiloxane (A), the white pigment (B), the inorganic filler (C), the curing catalyst (D), and the coupling agent (E) were blended at the amount indicated in Table 1, and the mixture was kneaded by rolls, cooled, and pulverized to produce the white silicone resin composition.

The thus produced compositions were evaluated for the following properties. The results are shown in Table 1. The molding was conducted by using a transfer molding machine.

[Molding Hardness]
A bar having a size of 10 mm×4 mm×100 mm was molded under the conditions of 175° C. and 6.86 MPa and a molding time of 120 seconds, and hot hardness was measured by Shore D durometer.

[Room Temperature Flexural Strength and Flexural Modulus]
A test piece was molded under the conditions of 175° C. and 6.9 N/mm² and a molding time of 120 seconds by using a mold according to JIS-K6911, and the test piece was evaluated for its flexural strength and flexural modulus at room temperature (25° C.).

[Glass Transition Temperature and Coefficient of Linear Expansion]
A cured article having a size of 5 mm×5 mm×15 mm was molded under the conditions of 175° C. and 6.9 N/mm² and a molding time of 120 seconds. After post-curing at a temperature of 180° C. for 4 hours, glass transition temperature, coefficient of linear expansion 1, and coefficient of linear expansion 2 were evaluated by using TMA8140C manufactured by Rigaku at a temperature elevation speed of 5° C./min.
Coefficient of linear expansion 1:
coefficient of linear expansion at −120 to 60° C.
Coefficient of linear expansion 2:
coefficient of linear expansion at 60 to 120° C.

[Heat Resistance, Yellowing]
A disk having a diameter of 50 mm and a thickness of 3 mm was molded under the conditions of 175° C. and 6.9 N/mm² and a molding time of 180 seconds. After allowing to stand at 180° C. for 24 hours and IR reflow, change in the appearance of the surface was visually inspected to evaluate the yellowing resistance.

[Reflectivity]
A disk (cured article) having a diameter of 50 mm and a thickness of 3 mm was molded under the conditions of 175° C. and 6.9 N/mm² and a molding time of 180 seconds. Immediately after the molding, the article was allowed to stand at 180° C. for 24 hours, and reflectivity at a wavelength of 450 nm after 24 hours of UV irradiation (a high pressure mercury lamp (60 mW/cm) having a peak wavelength of 365 nm) was measured by using X-rite 8200 purchased from SDG.

[Adhesion]
The resin composition was formed on an Ag-plated substrate having a size of 20 mm×20 mm at a temperature of 175° C. and a molding pressure of 70 kgf/cm² in a molding time of 180 seconds to prepare a test piece for evaluation of the adhesion. This test piece was post-cured at 180° C. for 4 hours, and the adhesion was thereafter evaluated.

TABLE 1

| Components (parts by weight) | | | Example 1 | 2 | 3 | 4 | 5 | 6 | 7 | Comparative Example 1 | 2 | 3 |
|---|---|---|---|---|---|---|---|---|---|---|---|---|
| (A) Thermosetting organopolysiloxane | | A-1 | 100 | 100 | 100 | 100 | 100 | 100 | | 100 | 100 | |
| | | A-2 | | | | | | | 100 | | | |
| | | A-3 | | | | | | | | | | 100 |
| (B) White pigment | CR-95 | B-1 | 100 | 100 | 100 | 100 | 100 | 100 | 100 | | 100 | 100 |
| (C) Inorganic filler | FB-570 | C-1 | 400 | 470 | 530 | 650 | 820 | 950 | 950 | 300 | 950 | 950 |
| (D) Condensation catalyst | Zinc benzoate | D-1 | 3 | 3 | 3 | 3 | 3 | 3 | 3 | 3 | 3 | 3 |
| (E) Coupling agent | KBM803 | E-1 | 0.5 | 0.5 | 0.5 | 0.5 | 0.5 | 0.5 | 0.5 | 0.5 | | 0.5 |
| | KBM403E | E-2 | 0.5 | 0.5 | | 2 | 2 | 3 | 3 | | 3 | 3 |
| | KBM503 | E-3 | | | 0.5 | | | | | | | |

TABLE 1-continued

| Components (parts by weight) | | Example 1 | 2 | 3 | 4 | 5 | 6 | 7 | Comparative Example 1 | 2 | 3 |
|---|---|---|---|---|---|---|---|---|---|---|---|
| Proportion of the component (B) in the composition (Parts by weight) | | 16.6 | 14.8 | 13.6 | 11.7 | 9.8 | 8.6 | 8.6 | 0 | 8.7 | 8.6 |
| Proportion of the components (B) and (C) in the composition (Parts by weight) | | 82.8 | 84.5 | 85.8 | 87.7 | 89.7 | 90.8 | 90.8 | 73.8 | 91.0 | 90.8 |
| Results of the evaluation | Flexural strength at room temperature (N/mm²) | 58 | 44 | 61 | 54 | 60 | 63 | 63 | 40 | 40 | 30 |
| | Flexural modulus at room temperature (N/mm²) | 7300 | 9800 | 10400 | 12200 | 14880 | 17580 | 16900 | 6500 | 18000 | 18900 |
| | Molded hardness | 75 | 80 | 80 | 80 | 80 | 80 | 80 | 60 | 80 | 26 |
| | Glass transition temperature (° C.) | −17 | −5 | −4 | −3 | −2 | 6 | 8 | −15 | −3 | −18 |
| | Coefficient of linear expansion 1 (ppm) | 18 | 12 | 11 | 9 | 7 | 6 | 7 | 20 | 6 | 37 |
| | Coefficient of linear expansion 2 (ppm) | 37 | 25 | 25 | 19 | 14 | 13 | 13 | 42 | 13 | 110 |
| Resistance to heat and yellowing | Initial (Appearance) | White | White | White | White | White | White | White | Gray | White | Yellow |
| | After heating to 180° C. for 24 hours (Appearance) | White | White | White | White | White | White | White | Gray | White | Yellow |
| | After IR reflow (Appearance) | White | White | White | White | White | White | White | Gray | White | Yellow |
| Reflectivity | Initial (%) | 90 | 89 | 90 | 91 | 90 | 91 | 91 | 53 | 91 | 78 |
| | After 180° C. for 24 hours (%) | 90 | 89 | 89 | 90 | 89 | 90 | 90 | 53 | 90 | 77 |
| | After UV irradiation for 24 hours (%) | 90 | 89 | 89 | 90 | 89 | 90 | 90 | 53 | 90 | 76 |
| Adhesion (kg/mm²) | | 4.9 | 4.8 | 4.6 | 4.9 | 4.8 | 4.7 | 4.5 | 3.9 | 0.3 | 4.1 |

As demonstrated by Examples 1 to 7 in Table 1, white thermosetting silicone resin compositions which provide a cured products showing reduced expansion, high curability, mechanical strength, whiteness, heat resistance, light resistance, consistency, and reduced yellowing were obtained. The results confirmed the usefulness of the semiconductor device produced by using the cured products of these compositions for encapsulating the LED reflector.

Japanese Patent Application No. 2008-068978 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An optical semiconductor case comprising the cured article of a white thermosetting silicone resin composition for molding an optical semiconductor case, the interior of the case being encapsulated by a transparent resin, said white thermosetting silicone resin composition comprising (A) 100 parts by weight of a thermosetting organopolysiloxane,
(B) 3 to 200 parts by weight of a white pigment,
(C) 400 to 1,000 parts by weight of an inorganic filler (other than the white pigment),
(D) 0.01 to 10 parts by weight of a condensation catalyst, and
(E) 0.1 to 8 parts by weight of a coupling agent represented by the following structural formula (2):

$$R^3_d Si(OR^2)_e \quad (2)$$

wherein $R^3$ represents an organic group of 1 to 10 carbon atoms containing a mercapto group, a glycidl group, or an amino group, $R^2$ independently represents an organic group of 1 to 4 carbon atoms, d represents 1 or 2, and e represents 2 or 3, wherein a content of the white pigment (B) is 1 to 50% by weight in relation to the entire white thermosetting silicone resin composition, and a total content of the white pigment (B) and the inorganic filler (C) is 70 to 93% by weight in the entire white thermosetting silicone resin composition.

2. The optical semiconductor case of claim 1, wherein the thermosetting organopolysiloxane (A) is represented by the following average compositional formula (1):

$$(CH_3)_a Si(OR^1)_b (OH)_c O_{(4-a-b-c)/2} \quad (1)$$

wherein $R^1$ independently represents an organic group of 1 to 4 carbon atoms, and a, b, and c are numbers satisfying the relations: $0.1 \leq a \leq 1.1$, $0 \leq b \leq 0.3$, $0.001 \leq c \leq 0.5$, and $0.801 \leq a+b+c < 2$.

3. The optical semiconductor case of claim 1, wherein the white pigment (B) is titanium oxide.

4. The optical semiconductor case of claim 1, wherein the white thermosetting silicone resin composition provides a cured product having a coefficient of linear expansion at a temperature not lower than the glass transition temperature of 10 to 40 ppm.

* * * * *